:::

United States Patent
Kojima et al.

(10) Patent No.: US 8,207,061 B2
(45) Date of Patent: Jun. 26, 2012

(54) SEMICONDUCTOR DEVICE MANUFACTURING METHOD USING VALVE METAL AND NITRIDE OF VALVE METAL

(75) Inventors: Yasuhiko Kojima, Nirasaki (JP); Taro Ikeda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 645 days.

(21) Appl. No.: 12/374,097

(22) PCT Filed: Jun. 15, 2007

(86) PCT No.: PCT/JP2007/062136
§ 371 (c)(1),
(2), (4) Date: Jan. 16, 2009

(87) PCT Pub. No.: WO2008/010370
PCT Pub. Date: Jan. 24, 2008

(65) Prior Publication Data
US 2009/0321936 A1    Dec. 31, 2009

(30) Foreign Application Priority Data
Jul. 20, 2006 (JP) .................. 2006-197662

(51) Int. Cl.
*H01L 21/4763* (2006.01)
(52) U.S. Cl. ......... 438/637; 438/639; 438/653; 438/687
(58) Field of Classification Search .......... 438/618–641, 438/652–657, 685–688, E23.145
See application file for complete search history.

(56) References Cited

U.S. PATENT DOCUMENTS

| | | | |
|---|---|---|---|
| 6,903,016 B2 | 6/2005 | Cohen | |
| 7,413,977 B2* | 8/2008 | Shimizu et al. | 438/637 |
| 2001/0005056 A1 | 6/2001 | Cohen | |
| 2003/0089928 A1 | 5/2003 | Saito et al. | |
| 2004/0087171 A1 | 5/2004 | Cohen | |
| 2007/0023917 A1* | 2/2007 | Yamada | 257/762 |
| 2007/0108616 A1 | 5/2007 | Nakagawa et al. | |

FOREIGN PATENT DOCUMENTS

| | | |
|---|---|---|
| CN | 1420560 A | 5/2003 |
| JP | 2000 195863 | 7/2000 |
| JP | 2003 511858 | 3/2003 |
| JP | 2003-152077 | 5/2003 |
| JP | 2005 347511 | 12/2005 |

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

Provided is a semiconductor device which has excellent adhesiveness to a copper film and a base film thereof and has a small resistance between wirings. The semiconductor device includes a porous insulating layer (SIOC film 11) which absorbed water from the atmosphere, and a substrate (wafer W) having a trench 100 formed on such insulating film is placed in a processing chamber. The substrate is coated with a first base film (Ti film 13) made of a valve metal. The surface of the first film brought into contact with the insulating film is oxidized by the water discharged from the insulating layer, and a passivation film 13a is formed. The surface of the first base film is coated with a second base film made of nitride or carbide of the valve metal, and a copper film 15 is formed on the surface of the second base film by CVD by using a copper organic compound as a material.

5 Claims, 5 Drawing Sheets

SEMICONDUCTOR DEVICE MANUFACTURING METHOD USING VALVE METAL AND NITRIDE OF VALVE METAL

FIELD OF THE INVENTION

The present invention relates to a technology for manufacturing a semiconductor device having excellent adhesiveness between a copper film and a base film thereof.

BACKGROUND OF THE INVENTION

In a recent wiring technology, copper lines are replacing aluminum lines to improve performance of a semiconductor device. In a manufacturing process of the semiconductor device, a technology for forming a copper film on a surface of a semiconductor wafer (hereinafter, referred to as a "wafer") is important. A chemical vapor deposition method (hereinafter, referred to as "CVD") using a copper organic compound as a material has been known as one of technologies for forming a copper film on the wafer.

When a copper film is formed on the wafer having an interlayer insulating film (hereinafter, referred to as an "insulating film") by using CVD, a copper organic compound, e.g., Cu(hexafluoroacetylacetonate)trimethylvinylsilane (hereinafter, referred to as "Cu(hfac)TMVS") serving as a source gas is supplied to a processing chamber in a vacuum state, and the Cu(hfac)TMVS is thermally decomposed on the heated wafer to form the copper film on a surface of the insulating film. However, since copper atoms tend to be diffused into the insulating film, the copper film is formed on a diffusion barrier film (hereinafter, referred to as a "base film") called a barrier metal, which is formed in advance on the insulating film, instead of being directly formed on the insulating film. The base film employs titanium, tantalum or the like, and the barrier metal reacts with an organic material from the copper organic compound, thereby producing organic impurities at an interface between the copper film and the barrier metal.

If the copper film is grown on an organic impurity layer, adhesiveness between the base film and the copper film is weakened and a resistance between an upper copper line and a lower copper line increases. Accordingly, electrical characteristics deteriorate or the copper film is peeled off while processing the wafer, resulting in a reduction in production yield. Further, since the organic impurity layer has poorer wettability than the base film, copper can be easily aggregated to thereby reduce buriability of the copper in a trench having a high aspect ratio, thereby causing a defect of the copper line.

Meanwhile, a low-k material of a low dielectric constant is used as the insulating film for a higher speed operation in a semiconductor device. The insulating film is formed of a porous material, such as a material containing silicon, oxygen and carbon (hereinafter, referred to as "SiOC"), of a low dielectric constant. However, the insulating film made of a porous material easily absorbs water from the atmosphere, and discharges the water into the base film after the base film is coated on the surface of the insulating film.

Regarding such a phenomenon, the present inventors have a following conjecture. That is, the above-mentioned titanium and tantalum belong to a group of valve metals, and an oxide layer called a passivation film is formed on a contact surface with the insulating film to prevent water from passing therethrough. Accordingly, when a valve metal is used as the base film, although water is discharged from the insulating film, movement of the water is prevented by the passivation film formed on the contact surface with the insulating film. Thus, it is possible to prevent an oxide layer of poor adhesiveness to the copper film from being formed at the interface in contact with the copper film.

Therefore, the inventors have conducted an investigation on the use of titanium nitride or titanium carbide (nitride or carbide of a valve metal) for the base film of the copper film in order to solve a problem of formation of the organic impurity layer while maintaining advantages of the valve metal. However, when the above-mentioned materials are used as the base film, the passivation film formation is insufficient although it is possible to prevent formation of the organic impurity layer.

Further, Patent Document 1 discloses a method for forming a copper film for copper lines after nitride of titanium or tantalum is coated on the surface of the insulating film, but does not deal with the above-mentioned problem.

Patent Document 1: Japanese Laid-open Publication No. 2000-299296: claim 14

SUMMARY OF THE INVENTION

It is an object of the present invention to provide a method for manufacturing a semiconductor device of excellent adhesiveness between a copper film and a base film thereof and a small resistance between lines, an apparatus for manufacturing the semiconductor device, a computer program and a storage medium.

In accordance with a first aspect of the present invention, there is provided a semiconductor device manufacturing method comprising: coating a first base film made of a first valve metal on a surface of a porous insulating film formed on a substrate; coating a second base film made of nitride or carbide of a second valve metal on a surface of the first base film; loading the substrate having the base films into an airtightly sealed processing chamber; and forming a copper film on a surface of the second base film by supplying a source gas containing a copper organic compound into the processing chamber.

The semiconductor device manufacturing method may further include forming a passivation film made of oxide of the first valve metal between the insulating film and the first base film from a portion of the first base film and water included in the insulating film while maintaining the substrate having the first base film at a predetermined temperature.

In the semiconductor device manufacturing method, each of the first valve metal and the second valve metal may be selected from the group of valve metals consisting of titanium, tantalum, aluminum, niobium, hafnium, zirconium, zinc, tungsten, bismuth and antimony.

In the semiconductor device manufacturing method, the first valve metal and the second valve metal may be a same valve metal.

In the semiconductor device manufacturing method, the insulating film may be an insulating film containing silicon, oxygen and carbon.

In accordance with a second aspect of the present invention, there is provided a semiconductor device manufacturing apparatus comprising: a first processing chamber in which a substrate is loaded; a valve metal source supply unit connected to the first processing chamber to supply a gas containing a metal compound of a valve metal into the first processing chamber; a first reactant gas supply unit connected to the first processing chamber to supply a first reactant gas, which reacts with the metal compound to produce a valve metal, to the first processing chamber; a second reactant gas supply unit connected to the first processing chamber to supply a second reactant gas, which reacts with the metal compound to produce nitride or carbide of a valve metal, to the first processing chamber; a second processing chamber in which the substrate unloaded from the first processing chamber is loaded; a copper film source supply unit connected to the second processing chamber to supply a source gas containing a copper organic compound into the second processing chamber; a transfer chamber including a transfer unit for transferring a substrate from the first processing chamber to the second processing chamber, the transfer chamber being airtightly connected to the processing chambers; and a controller for controlling the valve metal source supply unit, the first reactant gas supply unit, and the transfer unit, wherein the controller controls the respective units to perform a step of loading a substrate having a porous insulating film into a first processing chamber, a step of coating a first base film made of a first valve metal on a surface of the insulating film by supplying the first reactant gas by using the first reactant gas supply unit while supplying the gas containing a metal compound into the first processing chamber by using the valve metal source supply unit, a step of coating a second base film made of nitride or carbide of a second valve metal on a surface of the first base film by supplying the second reactant gas by using the second reactant gas supply unit while supplying the gas containing a metal compound into the first processing chamber by using the valve metal source supply unit, a step of transferring the substrate having the base films from the first processing chamber to the second processing chamber by using the transfer unit to load the substrate into the second processing chamber, and a step of forming a copper film on a surface of the second base film by supplying the source gas containing a copper organic compound into the second processing chamber by using the copper film source supply unit.

In accordance with a third aspect of the present invention, there is provided a semiconductor device having a diffusion barrier film, wherein the diffusion barrier film includes a passivation film formed of oxide of a first valve metal, a first base film formed of the first valve metal, and a second base film formed of nitride or carbide of a second valve metal, the films being sequentially stacked.

In the semiconductor device, each of the first valve metal and the second valve metal may be selected from the group of valve metals consisting of titanium, tantalum, aluminum, niobium, hafnium, zirconium, zinc, tungsten, bismuth and antimony.

In the semiconductor device, the first valve metal and the second valve metal may be a same valve metal.

The semiconductor device may further include an insulating film containing silicon, oxygen and carbon, and the diffusion barrier film may be stacked on the insulating film.

In accordance with a fourth aspect of the present invention, there is provided a computer program for performing a semiconductor device manufacturing method on a computer, wherein the semiconductor device manufacturing method includes: coating a first base film made of a first valve metal on a surface of a porous insulating film formed on a substrate; coating a second base film made of nitride or carbide of a second valve metal on a surface of the first base film; loading the substrate having the base films into an airtightly sealed processing chamber; and forming a copper film on a surface of the second base film by supplying a source gas containing a copper organic compound into the processing chamber.

In accordance with a fifth aspect of the present invention, there is provided a storage medium storing a computer program for performing a semiconductor device manufacturing method on a computer, wherein the semiconductor device manufacturing method includes: coating a first base film made of a first valve metal on a surface of a porous insulating film formed on a substrate; coating a second base film made of nitride or carbide of a second valve metal on a surface of the first base film; loading the substrate having the base films into an airtightly sealed processing chamber; and forming a copper film on a surface of the second base film by supplying a source gas containing a copper organic compound into the processing chamber.

In accordance with a sixth aspect of the present invention, there is provided a computer program for performing a semiconductor device manufacturing method on a computer, wherein the semiconductor device manufacturing method includes: coating a first base film made of a first valve metal on a surface of a porous insulating film formed on a substrate; coating a second base film made of nitride or carbide of a second valve metal on a surface of the first base film; loading the substrate having the base films into an airtightly sealed processing chamber; forming a copper film on a surface of the second base film by supplying a source gas containing a copper organic compound into the processing chamber; and forming a passivation film made of oxide of the first valve metal between the insulating film and the first base film from a portion of the first base film and water included in the insulating film while maintaining the substrate having the first base film at a predetermined temperature.

In accordance with a seventh aspect of the present invention, there is provided a storage medium storing a computer program for performing a semiconductor device manufacturing method on a computer, wherein the semiconductor device manufacturing method includes: coating a first base film made of a first valve metal on a surface of a porous insulating film formed on a substrate; coating a second base film made of nitride or carbide of a second valve metal on a surface of the first base film; loading the substrate having the base films into an airtightly sealed processing chamber; forming a copper film on a surface of the second base film by supplying a source gas containing a copper organic compound into the processing chamber; and forming a passivation film made of oxide of the first valve metal between the insulating film and the first base film from a portion of the first base film and water included in the insulating film while maintaining the substrate having the first base film at a predetermined temperature.

In this case, the valve metal causes a passivation film (oxidized film) serving as a protection film on its surface, thereby preventing further oxidation. Preferably, each of the first valve metal and the second valve metal is selected from the group of valve metals consisting of titanium, tantalum, aluminum, niobium, hafnium, zirconium, zinc, tungsten, bismuth and antimony. Further, the insulating film may be an insulating film containing silicon, oxygen and carbon.

In accordance with the present invention, since the two base films having different properties are coated on the surface of a porous insulating film, it is possible to improve adhesiveness of a copper film formed of a copper organic compound. Specifically, the first base film made of a valve metal is coated on the surface of the insulating film which easily absorbs water, thereby forming the passivation film at an interface with the insulating film. Thus, it is possible to prevent movement of water and prevent an oxide layer of poor adhesiveness from being formed at an interface with the copper film. Further, the second base film made of a material, such as nitride or carbide of a valve metal, which is more difficult to react with an organic compound produced from a source gas of copper than titanium, is coated on the surface of the first base film. Then, the copper film is formed on the second base film by using a copper organic compound as a material. Accordingly, it is possible to prevent formation of an organic impurity layer. As a result, it is possible to improve adhesiveness between the copper film and the substrate and reduce a resistance of upper and lower copper lines. Further, it is possible to prevent the copper film from being peeled off while processing the substrate.

DETAILED DESCRIPTION OF THE EMBODIMENTS

Hereinafter, a semiconductor device manufacturing method in accordance with an embodiment of the present invention has following features. That is, titanium of a valve metal is coated as a first base film on a wafer having a porous SiOC film formed as an insulating film on its surface, and nitride of titanium is coated as a second base film on a surface of the first base film. Then, a copper film is formed by using a copper organic compound as a source gas. In this embodiment, a case in which the base films and the copper film are formed by using a semiconductor manufacturing apparatus called a cluster tool or a multi chamber will be described.

Figure 1:
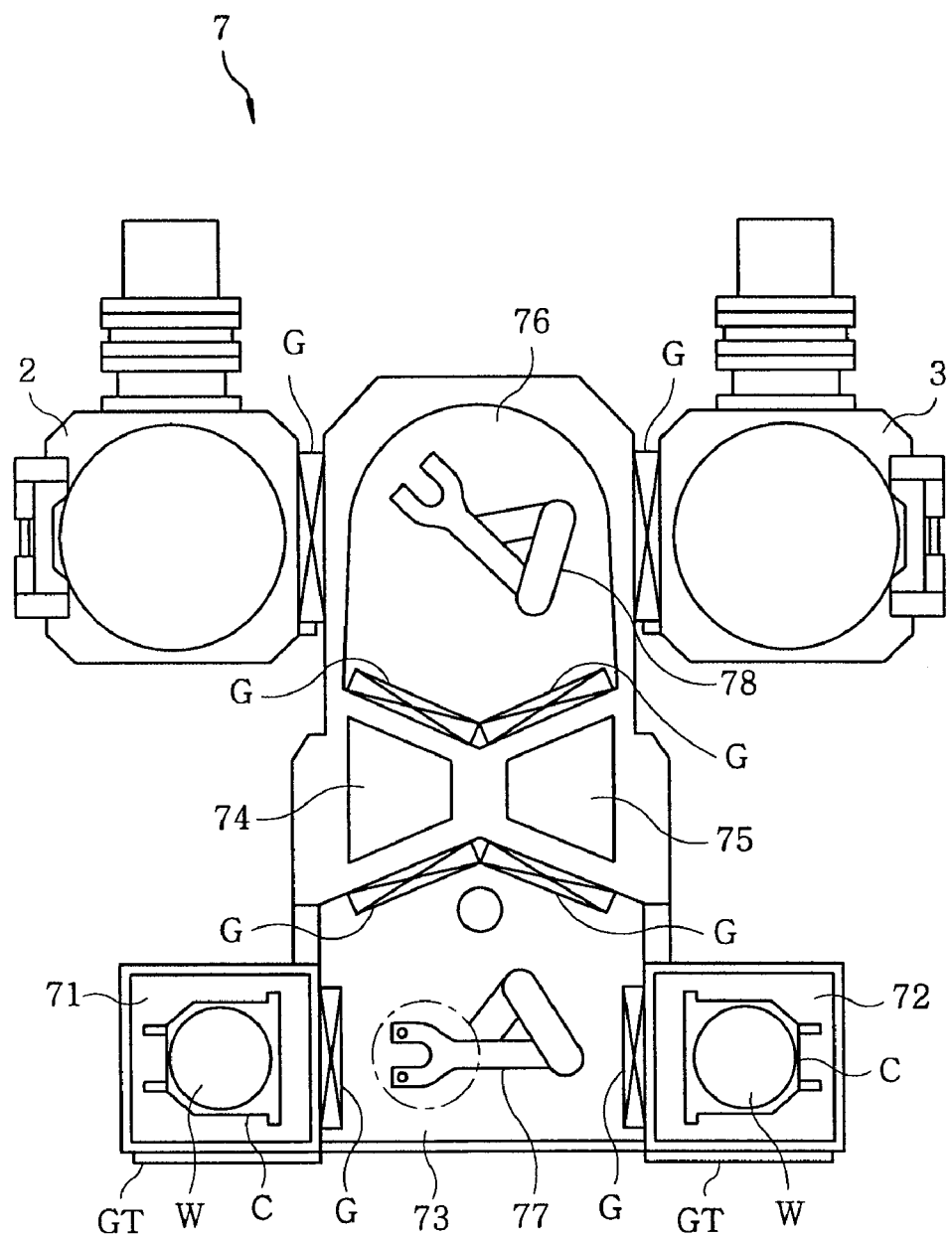
FIG. 1 is a plan view showing a semiconductor manufacturing apparatus in accordance with an embodiment of the present invention.

FIG. 1 is a plan view showing a cluster tool (semiconductor manufacturing apparatus 7) in accordance with an embodiment of the present invention. The semiconductor manufacturing apparatus 7 includes two carrier chambers 71 and 72 for receiving carriers (transfer containers) C containing wafers W from an atmospheric side through a gate door GT, first and second transfer chambers 73 and 76, preliminary vacuum chambers 74 and 75 provided between the first and second transfer chambers 73 and 76, and a first CVD apparatus 2 for performing coating of first and second base films, and a second CVD apparatus 3 for performing film formation of a copper film. The first and second transfer chambers 73 and 76 and the preliminary vacuum chambers 74 and 75 are airtightly sealed from the atmospheric side and may have a vacuum atmosphere or a nonreactive atmosphere. Further, a first transfer unit 77 is provided in the first transfer chamber 73 to transfer the wafer W between the carrier chambers 71 and 72 and the preliminary vacuum chambers 74 and 75, and a second transfer unit 78 is provided in the second transfer chamber 76 to transfer the wafer W between the preliminary vacuum chambers 74 and 75 and the CVD apparatuses 2 and 3.

Figure 2:
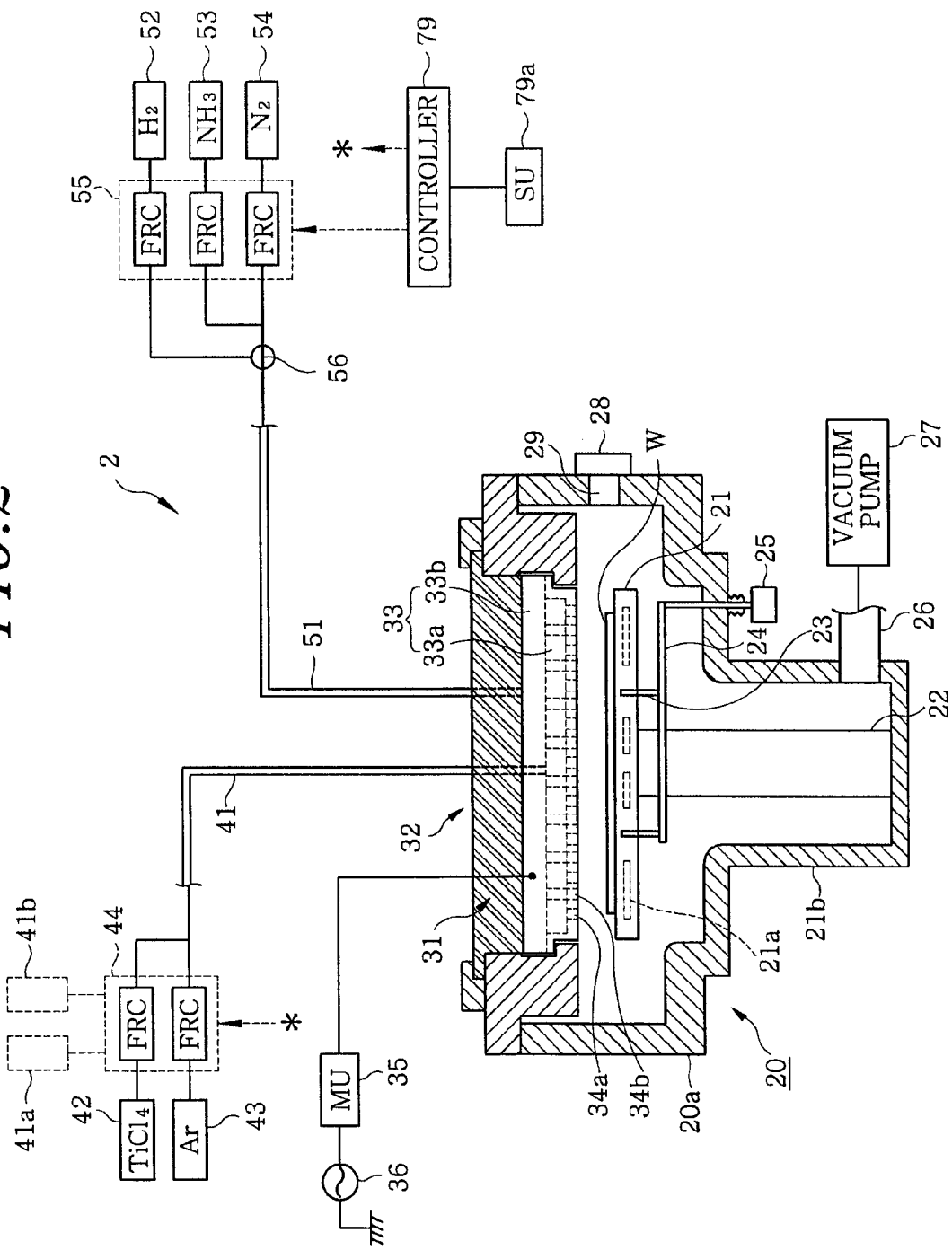
FIG. 2 is a longitudinal cross sectional view showing a first CVD apparatus included in the semiconductor manufacturing apparatus.

Next, the first CVD apparatus 2 for forming a base film on the wafer W will be described with reference to FIG. 2. FIG. 2 is a cross sectional view showing an example of the first CVD apparatus 2 for forming a base film of a two-layer structure on the wafer W. The first CVD apparatus 2 has a processing chamber (vacuum chamber) formed of, for example, aluminum. The processing chamber 20 is formed in a mushroom shape and includes a large-diameter cylindrical part 20a and a small-diameter cylindrical part 20b connected to a lower side of the large-diameter cylindrical part 20a. A heating unit (not shown) is provided in the processing chamber 20 to heat an inner wall of the processing chamber 20. A stage 21 for horizontally mounting the wafer W thereon is provided in the processing chamber 20. The stage 21 is supported by a support member 22 at a bottom portion of the small-diameter cylindrical part 20b.

A heater 21a serving as a temperature control device of the wafer W is provided in the stage 21. Further, for example, three elevating pins (only two pins are shown for simplicity) 23 for elevating the wafer W to perform a delivery to/from the second transfer unit 78 are provided in the stage 21 such that they can be protruded from a surface of the stage 21 and retracted into the stage 21. The elevating pins 23 are connected to an elevating mechanism 25 located outside the processing chamber 20 through a support member 24. A bottom portion of the processing chamber 20 is connected to one end of an exhaust pipe 26, and a vacuum pump 27 is connected to the other end of the exhaust pipe 26. Further, a transfer port 29 which is opened and closed by using a gate valve 28 (represented by G in FIG. 1) is formed at a sidewall of the large-diameter cylindrical part 20a of the processing chamber 20.

Further, an opening 31 is formed at a ceiling portion of the processing chamber 20. A shower head 32 is provided to close the opening 31 and face the stage 21. The shower head 32 has two gas chambers 33a and 33b and two type gas supply holes 34a and 34b. A gas supplied to one gas chamber 33a is supplied into the processing chamber 20 through the gas supply holes 34a and a gas supplied to the other gas chamber 33b is supplied into the processing chamber 20 through the gas supply holes 34b.

Further, a source gas supply line 41 is connected to the gas chamber 33a. The source gas supply line 41 is divided into two parts connected to a source gas supply source 42 for supplying $TiCl_4$ as a source of titanium or titanium nitride and a carrier gas supply source 43 for supplying an Ar gas as a carrier gas of $TiCl_4$, respectively, at their upstream sides. Further, a reference numeral '44' designates a flow rate controller which includes a mass flow controller or a valve to control a supply amount of the source gas or the carrier gas.

Further, the source gas supply line 41, the source gas supply source 42, the carrier gas supply source 43 and the flow rate controller 44 form a valve metal source supply unit.

On the other hand, a reactant gas supply line 51 is connected to the gas chamber 33b. The reactant gas supply line 51 is divided into two parts through a three-way valve 56. One part of the reactant gas supply line 51 is connected to a hydrogen supply source 52 for supplying a hydrogen gas for forming a titanium film by reducing $TiCl_4$ at its upstream side. Further, the other part of the reactant gas supply line 51 is further divided and connected to an ammonia gas supply source 53 for supplying ammonia which reacts with $TiCl_4$ to form a titanium nitride film and a carrier gas supply source 54 for supplying nitrogen as a carrier gas at their upstream sides. Further, a reference numeral '55' designates a flow rate controller for controlling a supply amount of each gas. Further, the reactant gas supply line 51, the hydrogen supply source 52 and the flow rate controller 55 form a first reactant gas supply unit. The reactant gas supply line 51, the ammonia gas supply source 53, the carrier gas supply source 54 and the flow rate controller 55 form a second reactant gas supply unit.

Further, a gas chamber 33 is made of a metal material and an upper surface of the gas chamber 33 is connected to a radio frequency (RF) power supply 36 through a matching unit 35. The stage 21 facing the shower head 32 is also made of a metal material. In this configuration, the gas chamber 33 and the stage 21 serve as an upper electrode and a lower electrode, respectively, which convert a gas supplied to the wafer W into plasma to promote film formation. Further, the gas chamber 33 is isolated from the processing chamber 20 via an insulating member 37 or the like, and the stage 21 is grounded.

Further, the flow rate controllers 44 and 55, a pressure controller (not shown) provided in the exhaust pipe 26, a switch of the heater 21a or the RF power supply 36, the elevating mechanism 25 and the like are controlled by a controller 79 for controlling an entire operation of the semiconductor manufacturing apparatus 7. The controller 79 includes, for example, a computer having a program storage part (not shown). The program storage part stores a computer program including steps (commands) of an operation or a process for loading/unloading the wafer W to/from the processing chamber 20. Further, the controller 79 controls the operation of the first CVD apparatus 2 by reading a corresponding computer program. Further, the computer program is stored in the program storage part while being stored in a storage unit 79a such as a hard disk, a compact disk, a magneto-optical disk, a memory card or the like.

Next, the second CVD apparatus 3 for forming a copper film by using an organic material of copper will be described. The second CVD apparatus 3 has substantially a same configuration as, for example, that of the first CVD apparatus 2 shown in FIG. 2. Accordingly, in the following description, the second CVD apparatus 3 will be described with reference to the first CVD apparatus 2 shown in FIG. 2. A processing chamber 20 of the second CVD apparatus 3 includes a stage 21, a transfer port 29 and the like and has the same configuration as that of the first CVD apparatus 2. However, a source gas supply line 41 of a shower head 32 is connected to only one source, i.e., a source tank 41a (see FIG. 2) at its upstream side. The source tank 41a contains Cu(hfac)TMVS in a liquid state, which is a copper organic compound (complex) serving as a material (precursor) of a copper film.

The Cu(hfac)TMVS is compressed by, for example, an Ar gas from a carrier gas supply source 41b (see FIG. 2) and pushed toward the shower head 32. The Cu(hfac)TMVS is vaporized as it is made in a contact and mixed with a hydrogen gas serving as a carrier gas by using a vaporizer and then supplied into the gas chamber 33a. The second CVD apparatus 3 includes one gas chamber 33a and one type gas supply holes 34a to form a copper film from one type source gas. Accordingly, the second CVD apparatus 3 is different from the first CVD apparatus 2 including two gas chambers and two type gas supply holes. Further, the second CVD apparatus 3 does not have an RF power supply 36 and is a thermal CVD apparatus for forming a copper film by heat supplied from the heater 21a. Further, the source gas supply line 41, the source tank 41a, the carrier gas supply source 41b and the flow rate controller 44 form a unit for supplying a material of a copper film.

Further, a flow rate controller 44 for controlling a supply amount of a Cu(hfac)TMVS gas, the heater 21a and the like are controlled by a controller 79 of the semiconductor manufacturing apparatus 7 in the same manner as the first CVD apparatus 2. A loading/unloading operation or process of the wafer W is performed based on a program stored in a program storage part.

Figure 3A:
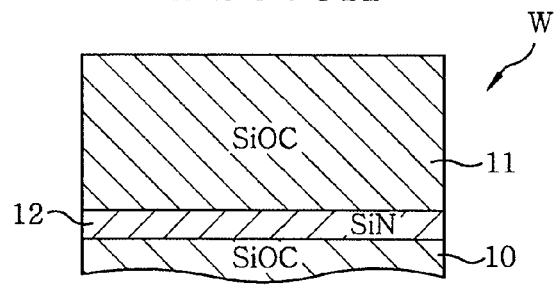
FIGS. 3A to 3D are cross sectional views showing a surface portion of a semiconductor device manufactured in accordance with the embodiment of the present invention.

Hereinafter, a semiconductor device manufacturing method using the semiconductor manufacturing apparatus 7 having the above configuration will be described. FIGS. 3A to 3D are cross sectional views showing a process for manufacturing a semiconductor device formed on a surface of the wafer W. FIG. 3A illustrates a state before a trench is formed in an insulating film. Meanwhile, for simplicity of description, copper is assumed to be buried by a single damascene method and FIGS. 3A to 3D show cross sectional views of a region having no via hole. Reference numerals '10' and '11' designate insulating SiOC films (carbon-containing silicon oxide films), and a reference numeral '12' designates an SiN film (silicon nitride film).

Figure 3B:
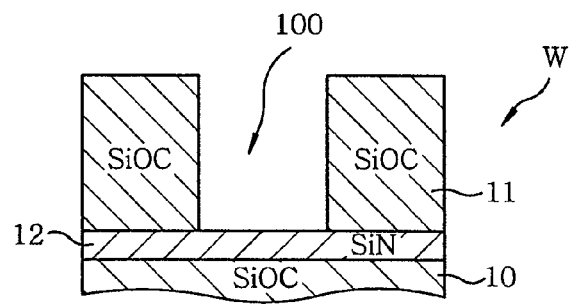

In this case, the SIOC films 10 and 11 and the SiN film 12 can be formed on the wafer W by, e.g., a plasma film forming process. First, the SiOC film 11 is etched in a specific pattern shape by using, for example, a $CF_4$ gas or $C_4F_8$ gas as an etching gas. In this case, the SiN film 12, which is a base film of the SiOC film 11, serves as an etching stopper. Accordingly, for example, as shown in FIG. 3B, a trench 100 having a line width of, e.g., about 100 nm is formed in the SiOC film 11 to bury copper for wiring therein.

The wafer W having the trench 100 is loaded into the carrier chambers 71 and 72 of the semiconductor manufacturing apparatus 7 shown in FIG. 1. Then, the wafer W is delivered by the first transfer unit 77 through the preliminary vacuum chambers 74 and 75 to the second transfer unit 78. First, the second transfer unit 78 transfers the delivered wafer W to the first CVD apparatus 2. In this case, the SiOC film 11 of an insulating film is porous and etching is performed on the SiOC film 11 after film formation. Accordingly, the SiOC film 11 has water absorbed from the atmosphere while the wafer W is being transferred after being loaded into the semiconductor manufacturing apparatus 7.

Figure 3C:
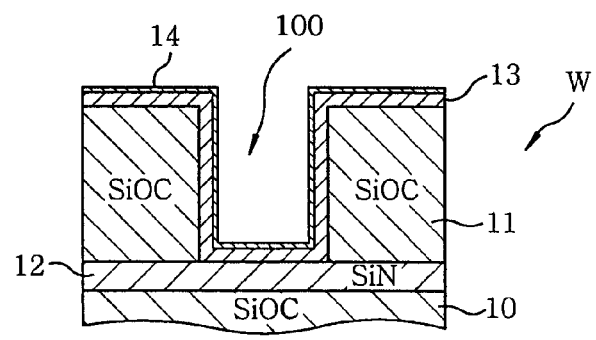

In the first CVD apparatus 2, as shown in FIG. 3C, a Ti film 13 serving as a first base film and a TiN film 14 serving as a second base film are coated on the wafer W. Specifically, first of all, an inside of the processing chamber 20 is maintained in a vacuum state by using the vacuum pump 27. Then, an Ar gas is supplied at a specific flow rate to the processing chamber 20 from the carrier gas supply source 43. Further, the stage 21 is heated to a predetermined temperature ranging, e.g. from 600° C. to 700° C. by using the heater 21a. Also, the processing chamber 20 is heated by using the heating unit (not shown) and an inner temperature of the processing chamber 20 is maintained at a predetermined temperature.

Then, the gate valve 28 is opened and the wafer W is loaded into the processing chamber 20 by using the second transfer unit 78. The wafer W is delivered to an upper surface of the stage 21 through the elevating pins 23, and the gate valve 28 is closed. Thereafter, a $TiCl_4$ gas is supplied into the processing chamber 20 from the source gas supply source 42 with the Ar gas supplied from the carrier gas supply source 43. At the same time, a hydrogen gas is supplied into the processing chamber 20 from the hydrogen supply source 52. Accordingly, $TiCl_4$ is reduced and the Ti film 13 is coated on the surface of the SiOC film 11.

Figure 5:
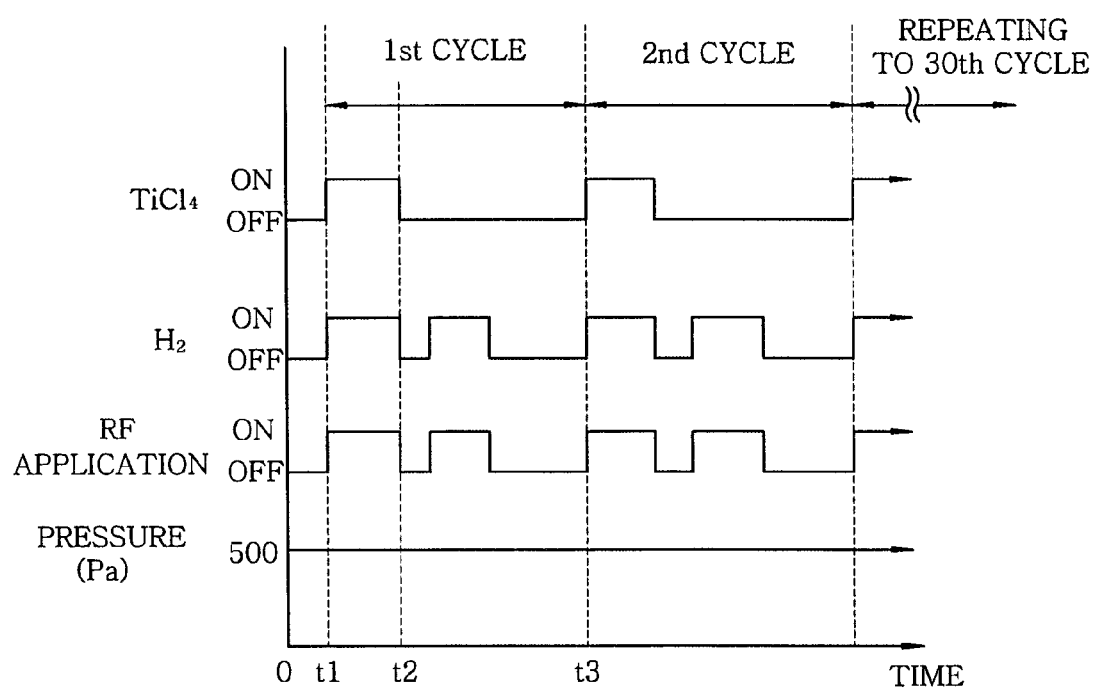
FIG. 5 illustrates supply and stop of various gases in term of time sequence when a titanium film is formed as a first base film by CVD.

FIG. 5 illustrates supply and stop of various gases and pressure variation in the processing chamber 20 in a process of coating the Ti film 13 on the surface of the wafer W in terms of time sequence. The wafer W mounted on the stage 21 is heated to a predetermined temperature and an inner temperature of the processing chamber 20 is maintained at a predetermined temperature. Also, the pressure in the processing chamber 20 is maintained at, e.g., 500 Pa. Then, as shown in FIG. 5, at a time t1, each of supply of a $TiCl_4$ gas (containing an Ar gas as a carrier gas) serving as a source gas and supply of a hydrogen gas is switched to an ON state, and the RF power supply 36 is switched to an ON state. These gases are supplied into the processing chamber 20 at specific flow rates until a time t2, thereby performing a plasma film forming process. The Ti film 13 is formed on the surface of the SiOC film 11 in accordance with Eq. (1):

$$TiCl_4 + 4H^* \rightarrow Ti + 4HCl \quad \text{Eq. (1)}.$$

Subsequently, at a time t2, the supply of TiCl$_4$ gas serving as a source gas, the supply of hydrogen gas and RF application are stopped, and an unreacted gas or reaction by-products remaining in the processing chamber 20 are removed. In this step, while the supply of TiCl$_4$ gas serving as a source gas is stopped, a hydrogen gas is supplied at a specific flow rate for a specific period of time, and the RF power supply 36 is switched to an ON state, thereby generating a hydrogen plasma. Accordingly, residual chlorine included in the Ti film 13 is reduced and removed by the hydrogen plasma.

Further, the supply of hydrogen gas and RF application are stopped, and a residual hydrogen gas in the processing chamber 20 is discharged. In this case, for example, a nitrogen gas may be supplied. The above-described control is performed and, at a time t3, one cycle is ended.

Then, the same process as the process performed from the time t1 to the time t3 is repeated for ten or more cycles, preferably, thirty cycles, and the Ti film 13 of a desired thickness is formed. The number of cycles may be appropriately controlled based on a thickness of a thin film formed for one cycle or a desired thickness of the Ti film 13. Meanwhile, although the TiCl$_4$ gas serving as a source gas and the hydrogen gas are supplied simultaneously for film formation in the above embodiment, it may employ a so-called atomic layer deposition (ALD) method in which only a TiCl$_4$ gas serving as a source gas is supplied at an initial step to be adsorbed to the surface of the SiOC film 11, and after the inside of the processing chamber 20 is exhausted, a hydrogen gas is supplied while RF application is performed to form the Ti film 13.

Next, a process of coating the TiN film 14 on the surface of the Ti film 13 formed in the above-described process will be described. In this embodiment, the first CVD apparatus 2 which has performed formation of the Ti film 13 successively performs formation of the TiN film 14 on the surface of the Ti film 13. Specifically, while a TiCl$_4$ gas serving as a source gas is supplied into the processing chamber 20, a nitrogen gas is supplied from the carrier gas supply source 54 and an ammonia gas is supplied from the ammonia gas supply source 53. In this case, the TiCl$_4$ gas reacts with the ammonia gas, and the TiN film 14 is formed in accordance with Eq. (2):

$$6TiCl_4 + 8NH_3 \rightarrow 6TiN + 24HCl + N_2 \quad \text{Eq. (2)}.$$

Further, supply and stop timings of a source gas and an ammonia gas for forming the TiN film 14, supply and stop timings of an ammonia gas for removing residual chlorine and a pressure in the processing chamber 20 are the same as in the case shown in FIG. 5 except that RF application is not performed by substituting supply and stop timings of a hydrogen gas for supply and stop timings of an ammonia gas. Thus, the description thereof is omitted. The formation of the TiN film 14 on the surface of the wafer W is completed by performing this process for a certain number of cycles. Then, the supply of source gas and ammonia gas is stopped and the processing chamber 20 is purged for a specific period of time. Further, the TiN film 14 may be formed by simultaneously supplying an ammonia gas and a nitrogen gas serving as a carrier gas into the processing chamber 20 which has performed formation of the Ti film 13 to nitrify the surface of the Ti film 13, instead of repeating the above-described cycles.

Figure 3D:
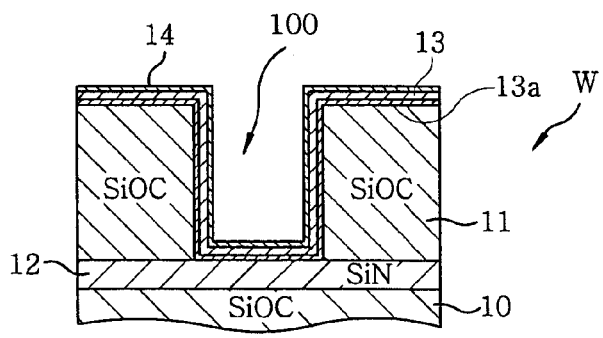

Through the above process, as shown in FIG. 3C, the Ti film 13 serving as a first base film and the TiN film 14 serving as a second base film are sequentially formed from bottom to top on the surface of the SIOC film 11 including the trench 100 in the wafer W. The wafer W is maintained at a predetermined temperature (e.g., 100 to 300° C. for 1 min). Accordingly, as described above, the surface of the Ti film 13 in contact with the SIOC film 11 is oxidized by water discharged from the SIOC film 11 having adsorbed water, thereby forming a passivation film 13a as shown in FIG. 3D. When the passivation film 13a is formed at a lower temperature, it is possible to obtain a film having a sufficient passivation effect by increasing a temperature maintaining time.

Figure 4A:
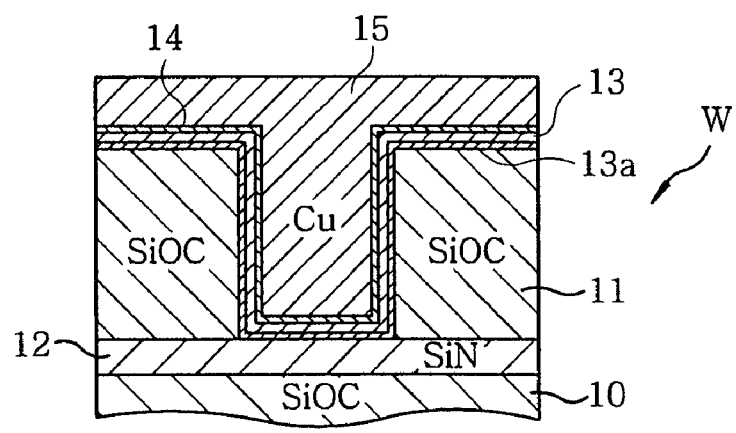
FIGS. 4A and 4B are cross sectional views showing the surface portion of the semiconductor device manufactured in accordance with the embodiment of the present invention.

Then, in the semiconductor manufacturing apparatus 7, the gate valve 28 of the first CVD apparatus 2 is opened and the processed wafer W is delivered to the second transfer unit 78. The wafer W is loaded into the second CVD apparatus 3 to form a copper film 15 on the surface of the TiN film 14 as shown in FIG. 4A. The second CVD apparatus 3 is operated in the same way as in the first CVD apparatus 2. That is, a vacuum state (e.g., 133 Pa) is realized in the processing chamber 20. Then, while a hydrogen gas is supplied, the stage 21 is heated to a temperature of 150° C. and an inner temperature of the processing chamber 20 is maintained at a predetermined temperature.

Then, in the same way as in the first CVD apparatus 2, after the wafer W is mounted on the stage 21, the flow rate controller 44 connected to the source gas supply line 41 is operated such that the Cu(hfac)TMVS vaporized by a vaporizer is supplied at a flow rate of, e.g., 510 mg/min (mass conversion) from the source tank 41a and a hydrogen gas serving as a carrier gas is also supplied at a flow rate of 100 sccm from the carrier gas supply source 41b. The Cu(hfac)TMVS supplied into the processing chamber 20 is thermally decomposed and copper combines with the TiN film 14, thereby forming the copper film 15 on the surface of the TiN film 14.

Meanwhile, when the copper film 15 is directly formed on the Ti film 13 which is difficult to react with an organic compound produced from a source gas of copper, as described in a conventional technology, an organic impurity layer, which deteriorates adhesiveness to the copper film 15 and increases a resistance between copper lines, is formed on the surface of the Ti film 13.

In comparison with the conventional technology, in the embodiment of the present invention, the copper film 15 is formed on the surface of the TiN film 14 which is more difficult to react with an organic compound produced from a source gas of copper than titanium. Accordingly, combination between the organic compound and the TiN film 14 is weak, and the organic compound becomes a stable material which is difficult to combine with the TiN film 14 and is discharged out of the processing chamber 20. As a result, it is possible to prevent formation of an organic impurity layer and improve adhesiveness between the copper film 15 and the TiN film 14. Further, since nitride of titanium (valve metal) is coated as a second base film, even though the passivation film 13a is insufficiently formed in the Ti film 13 and a portion of water discharged from the SIOC film 11 reaches the TiN film 14, a passivation film is formed on a lower surface (surface in contact with the Ti film 13) of the TiN film 14. Accordingly, the passivation film of the TiN film 14 and the passivation film 13a of the Ti film 13 doubly prevent an oxide layer from being formed at an interface with the copper film 15.

In order to form the copper film 15 of a desired thickness, after the Cu(hfac)TMVS gas is continuously supplied for a specific period of time, the supply thereof is stopped. Thereafter, the processed wafer W is unloaded by using the second transfer unit 78 and delivered to the first transfer unit 77 through the preliminary vacuum chambers 74 and 75. The wafer W is mounted on the carrier chamber 71 or 72 and the operation of the semiconductor manufacturing apparatus 7 is completed.

Figure 4B:
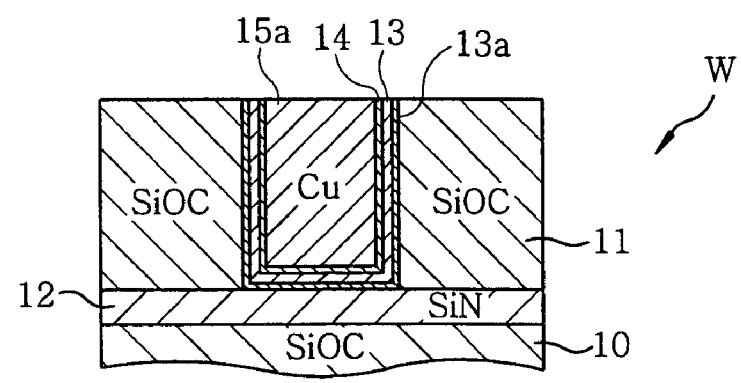

A chemical mechanical polishing (CMP) process is performed on the wafer W processed in the semiconductor manufacturing apparatus 7. Consequently, for example, as shown in FIG. 4B, the copper film 15 and the base films 13a, 13 and 14 outside the trench 100 are removed, thereby forming a copper line 15a in the trench 100.

The above-described embodiment of the present invention has the following effects. Since the two base films 13 and 14 having different properties are coated on the surface of the SIOC film 11 serving as a porous insulating film, it is possible to improve adhesiveness of a copper film formed of a copper organic compound. Specifically, the Ti film 13 made of a valve metal is coated as a first base film on the surface of the SiOC film 11 which easily absorbs water, thereby forming the passivation film 13a at an interface with the SiOC film 11. Thus, it is possible to prevent movement of water and prevent an oxide layer of poor adhesiveness from being formed at an interface with the copper film 15. Further, the TiN film 14 which is more difficult to react with an organic compound produced from a source gas of copper than titanium is coated as a second base film on the surface of the first base film. Then, the copper film 15 is formed by using a copper organic compound as a material. Accordingly, it is possible to prevent formation of an organic impurity layer. As a result, it is possible to improve adhesiveness between the copper film 15 and the wafer W and reduce a resistance of upper and lower copper lines 15a which are stacked through an SiOC film. Further, it is possible to prevent the copper film 15 from being peeled off while processing the wafer W.

Further, when a porous material such as SiOC is used as an insulating film, there is a technology for preventing oxidation of barrier metal by coating a dense SiOC film which discharges little water (having a higher dielectric constant than the porous material) on the porous insulating film. Compared to this technology, in the embodiment of the present invention, the Ti film 13 reacts with water in the SiOC film 11 to form the passivation film 13a capable of preventing water from passing therethrough. Further, the TiN film 14 can be formed in the same first CVD apparatus 2. Thus, it is possible to simplify a manufacturing process of a semiconductor device.

Further, in the above embodiment, the second base film may be formed of titanium carbide without being limited to titanium nitride. In this case, the ammonia gas supply source 53 of the first CVD apparatus 2 is replaced by a methane gas supply source to supply a methane gas, so that a source gas (TiCl$_4$) reacts with methane to form a titanium carbide film.

Further, a valve metal available for the first base film is not limited to titanium described in the embodiment. The first base film may employ other valve metals, for example, aluminum, niobium, hafnium, zirconium, zinc, tungsten, bismuth and antimony. In the same way, the second base film may employ nitride or carbide of these valve metals. In this case, the second base film may employ nitride or carbide of the same valve metal as that of the first base film or a different valve metal from it. Further, any insulating film capable of providing water for forming a passivation film with the valve metal may replace the insulating film made of a porous material.

Further, in the embodiment, as shown in FIG. 1, the first and second CVD apparatuses 2 and 3 are included in the cluster tool (semiconductor manufacturing apparatus 7) to successively perform processes for forming the Ti film 13, the TiN film 14 and the copper film 15. However, these processes may not be performed in the same apparatus. The first CVD apparatus 2 and the second CVD apparatus 3 may be installed at separate places, and the Ti film 13 and the TiN film 14 may be coated in the separate CVD apparatuses. On the other hand, coating of the Ti film and the TiN film and formation of the copper film may be performed in the same CVD apparatus.

What is claimed is:

1. A semiconductor device manufacturing method comprising:
   coating a first base film made of a first valve metal on a surface of a porous insulating film formed on a substrate;
   coating a second base film made of nitride or carbide of a second valve metal on a surface of the first base film;
   loading the substrate having the base films into an airtightly sealed processing chamber;
   forming a copper film on a surface of the second base film by supplying a source gas containing a copper organic compound into the processing chambers; and
   forming a passivation film made of oxide of the first valve metal between the insulating film and the first base film from a portion of the first base film and water included in the insulating film while maintaining the substrate having the first base film at a predetermined temperature.

2. The semiconductor device manufacturing method of claim 1, wherein each of the first valve metal and the second valve metal is selected from the group of valve metals consisting of titanium, tantalum, aluminum, niobium, hafnium, zirconium, zinc, tungsten, bismuth and antimony.

3. The semiconductor device manufacturing method of claim 1, wherein the first valve metal and the second valve metal are a same valve metal.

4. The semiconductor device manufacturing method of claim 1, wherein the insulating film is an insulating film containing silicon, oxygen and carbon.

5. A storage medium storing a computer program for performing a semiconductor device manufacturing method on a computer, wherein the semiconductor device manufacturing method includes:
   coating a first base film made of a first valve metal on a surface of a porous insulating film formed on a substrate;
   coating a second base film made of nitride or carbide of a second valve metal on a surface of the first base film;
   loading the substrate having the base films into an airtightly sealed processing chamber;
   forming a copper film on a surface of the second base film by supplying a source gas containing a copper organic compound into the processing chamber; and
   forming a passivation film made of oxide of the first valve metal between the insulating film and the first base film from a portion of the first base film and water included in the insulating film while maintaining the substrate having the first base film at a predetermined temperature.

* * * * *